United States Patent [19]

Madni

[11] 4,311,997
[45] Jan. 19, 1982

[54] APPARATUS FOR CONNECTING DATA POINTS ON A CATHODE RAY TUBE DISPLAY AND METHOD THEREFOR

[75] Inventor: Asad M. Madni, Los Angeles, Calif.

[73] Assignee: Systron Donner Corporation, Concord, Calif.

[21] Appl. No.: 955,367

[22] Filed: Oct. 27, 1978

[51] Int. Cl.³ .............................................. G06F 3/14
[52] U.S. Cl. ..................................... 340/722; 340/747; 340/728
[58] Field of Search ............... 340/722, 747, 739, 740, 340/736, 728

[56] References Cited

U.S. PATENT DOCUMENTS

| 3,098,219 | 7/1963 | Voight et al. | 340/722 |
|---|---|---|---|
| 3,493,732 | 2/1970 | Zeheb | 340/740 |
| 3,739,222 | 6/1973 | Hurd III | 340/722 |
| 3,768,092 | 10/1973 | Dodds, Jr. et al. | 340/740 |
| 3,792,464 | 2/1974 | Hamada et al. | 340/747 |
| 3,902,476 | 9/1975 | Hileman | 340/747 |
| 3,968,499 | 7/1976 | Lowe et al. | 340/722 |
| 4,119,956 | 10/1978 | Murray | 340/728 |
| 4,193,122 | 3/1980 | Bowers | 340/722 |

Primary Examiner—Marshall M. Curtis
Attorney, Agent, or Firm—Flehr, Hohbach, Test, Albritton & Herbert

[57] ABSTRACT

A dot connecting technique for the digital display of a spectrum analyzer generates vertical connecting lines between points by inhibiting the horizontal scan during such generation for a time period proportional to the vertical distance between dots to thereby provide connecting lines of constant intensity.

4 Claims, 4 Drawing Figures

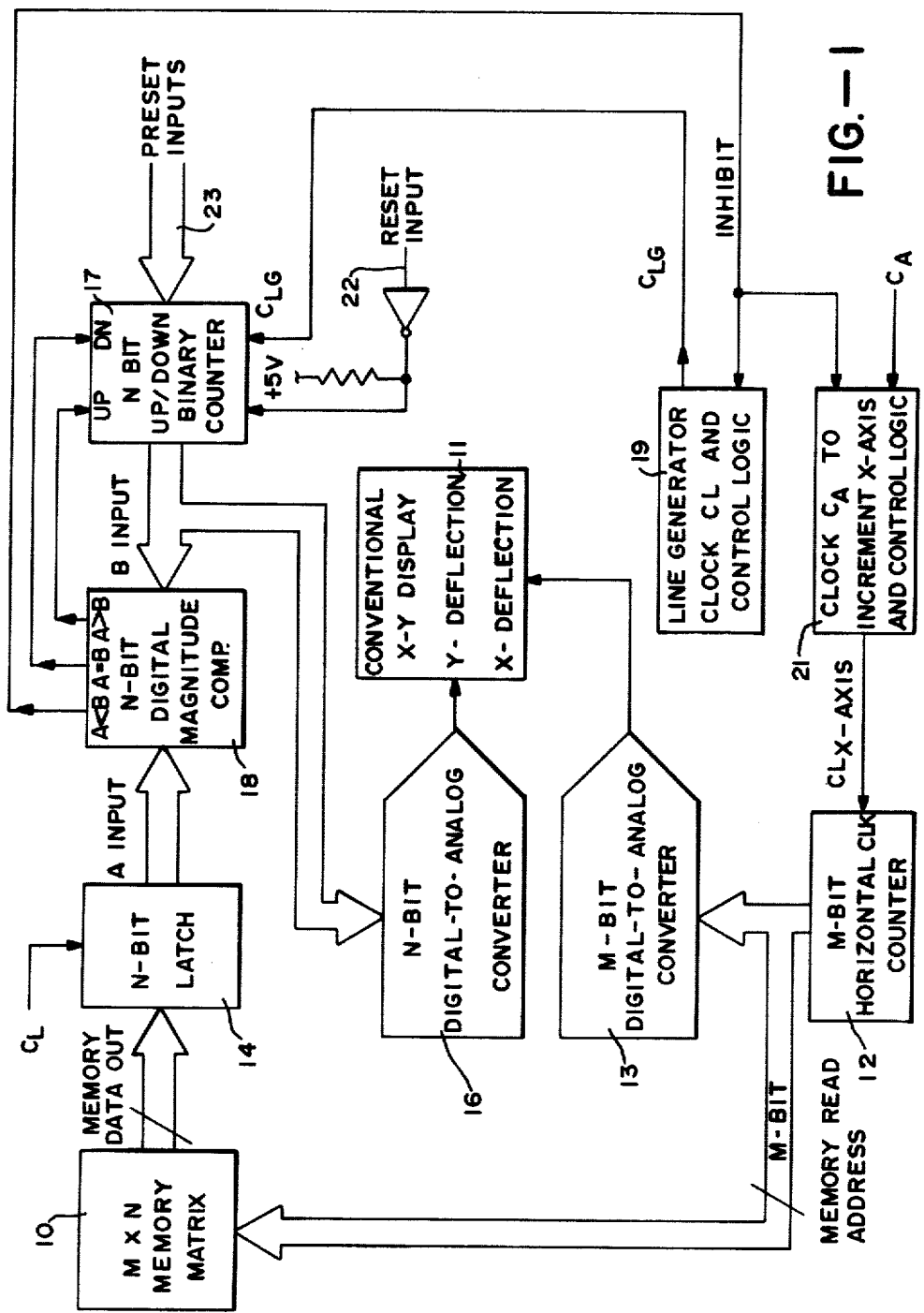
FIG.—1

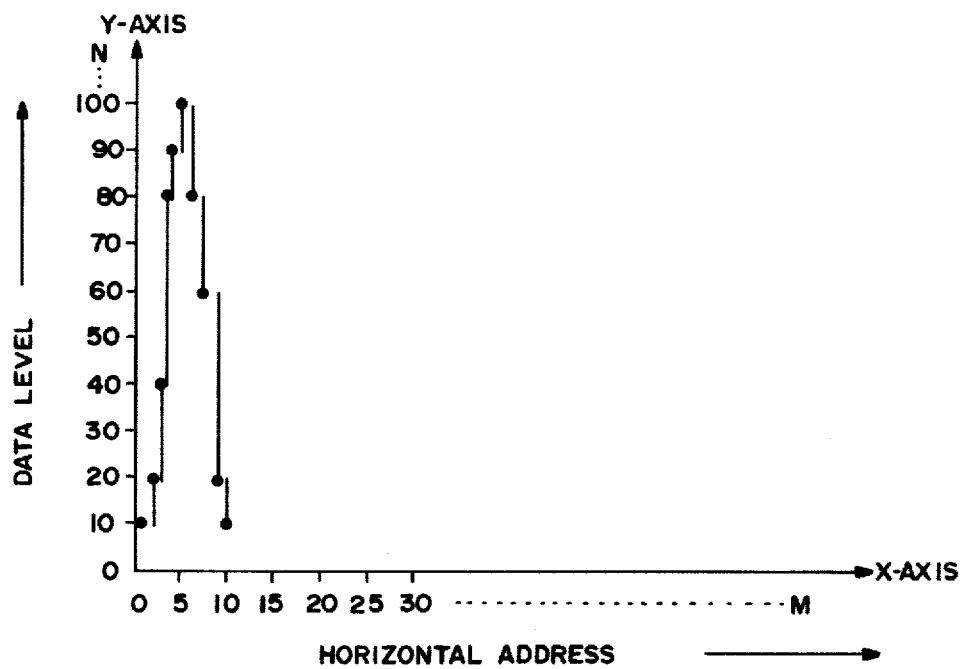
FIG.—2
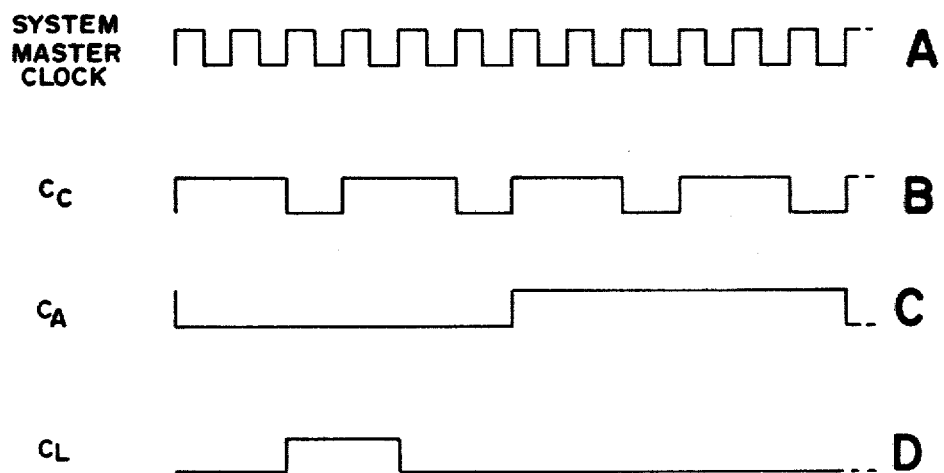
FIG.—3

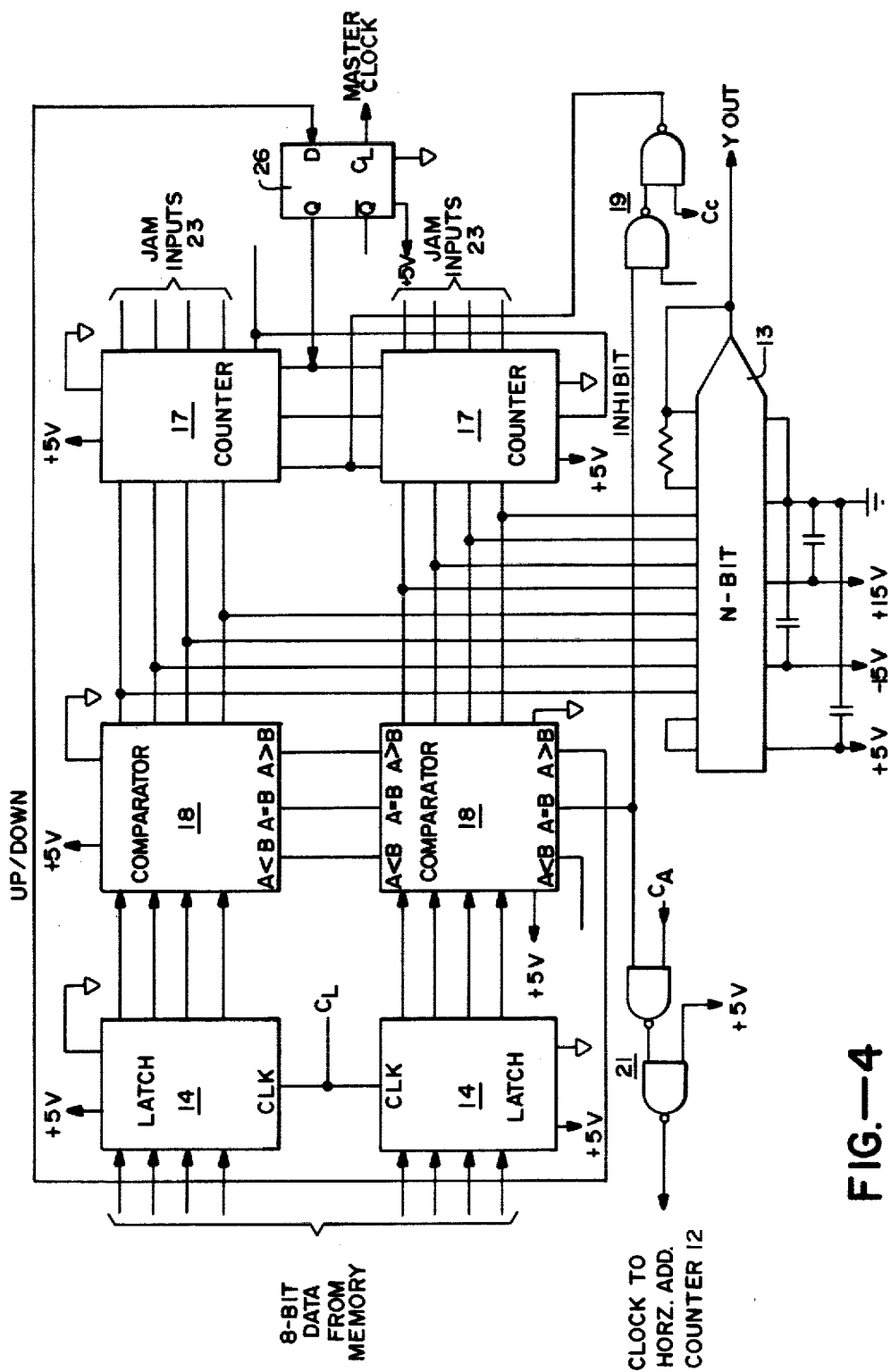
FIG.—4

4,311,997

APPARATUS FOR CONNECTING DATA POINTS ON A CATHODE RAY TUBE DISPLAY AND METHOD THEREFOR

The present invention is directed to apparatus for connecting data points on a cathode ray tube display and method therefor and more specifically to a cathode ray tube display used in connection with a spectrum analyzer with digital storage.

A spectrum analyzer in which a digital memory stores the Y axis data points for each portion of the frequency spectrum being analyzed is well-known as described in an article entitled "Digital Storage Improves and Simplifies Analysis of Low Frequency Signals" by Jerry Weibel and Larry Whatley, both of Hewlett-Packard Company, Loveland, Colo., which appeared in *Electronics,* June 21, 1973, page 116. In such digital displays, the data values are presented on the cathode ray tube (CRT) screen as dots. For high frequency signals, the display becomes very difficult to identify and some dot connecting technique is needed to readily identify the signal form.

One method of drawing lines between the display of dots or data points as taught by the above *Electronics* article is to sweep the X axis linearly and slew the Y axis at a rate that connects each point. A difficulty with this method is that the rate is necessarily variable since the distance between data points varies; therefore the intensity of the lines drawn will vary. Thus, the photograph of a CRT display may be unsatisfactory. In addition, this technique requires analog circuitry by way of sample and hold circuits. Another technique as discussed in the above *Electronics* article is to calculate the vectors between data points and slew the X and Y axes accordingly. This is obviously very complex.

It is, therefore, a general object of the present invention to provide an improved apparatus for connecting data points on a cathode ray tube display and method therefor.

It is a more specific object to provide a method as above in which the data points are connected with lines of constant intensity with the use of an inexpensive technique which lends itself to the digital structure of an electronic instrument such as a spectrum analyzer.

In accordance with the above objects there is provided a method of connecting data points on a cathode ray tube display. A predetermined number of discrete addresses are scanned horizontally. Data points are stored digitally each corresponding to a vertical axis display displacement and one of the horizontal addresses. The vertical axis displacement is determined between a data point being displayed at one address and the next data point to be displayed at another address. The horizontal scan is inhibited for a time proportional to this vertical axis displacement. During inhibiting there is a display of the effective vertical line between the data points.

There is also provided apparatus for connecting data points on a cathode ray tube display where the data points are stored in a digital memory at addresses corresponding to horizontal scan addresses of the display. An up/down binary counter stores binary data representing a previously displayed data point such data corresponding to a predetermined vertical axis display displacement. Comparator means compare the stored binary data with a data point stored in the digital memory at a subsequent address. The counter counts up or down depending on the vertical displacement of the data point of the subsequent address relative to the stored data point. Vertical axis display means are responsive to the counter counting up or down to concurrently display an effective vertical line at one horizontal address.

FIG. 1 is a block diagram embodying the present invention;

FIG. 2 illustrates a typical display produced by the present invention;

FIG. 3 is timing diagrams illustrating system phase relationships; and

FIG. 4 is a detailed block diagram of a portion of FIG. 1 embodying the present invention.

Referring to FIG. 1, an M×N memory matrix 10 provides the digital storage for the XY display 11. Such memory matrix is typically the digital storage unit of a spectrum analyzer. Each N bit data word which represents a Y data point on the display (that is the amount of signal at a particular frequency), is stored at various M memory addresses which correspond to the X or horizontal axis of display 11; in other words the frequency scan axis. Referring briefly to FIG. 2, this illustrates the N data levels of the display and the M horizontal address or frequency axis. An M bit horizontal counter 12 provides the read addresses for memory 10 and additionally besides addressing the memory also drives an M bit digital to analog converter 13 the scaled output of which produces the necessary X deflection for the display 11. The data level, N, is read out of the memory matrix 10 into an N bit latch 14 which is clocked by a clock input $C_L$. Eventually as will be described below, this N bit data is converted or scaled by an N bit digital to analog converter 16 to drive the Y deflection circuit of display 11. As thus far described, the circuit is substantially equivalent to the *Electronics* article circuit or in fact any digital storage type spectrum analyzer.

In accordance with the invention, which provides a technique of generating lines of constant intensity between data points presented on the screen as illustrated in FIG. 2, the N bit digital data to analog converter 16 (which drives the Y deflection circuits of the XY display 11), is driven by an N bit up/down binary counter 17. This counter is controlled in direction by an N bit digital magnitude comparator 18 which compares the A input of N bit latch 14 and the B input of up/down counter 17. As indicated, if A is less than B, the counter is forced to count down; if A is greater than B, the counter counts up; and if A is equal to B, then another function takes place. Specifically, this output of the comparator is designated an INHIBIT line which inhibits a line generator clock 19. This line generator generates a clock $C_C$ on its output line designated $C_{LG}$ which drives the up/down binary counter. The INHIBIT line from comparator 18 also enables the clock $C_A$ which increments the X axis horizontal scan by clocking horizontal counter 12.

Counter 17 also includes a standard reset input 22 and preset inputs 23 which are used for initializing the circuit. For example, the preset and reset inputs can be used to draw a vertical cursor on the screen.

In the preferred embodiment there would be interposed between latch 14 and comparator 18 a base line clipper circuit as disclosed and claimed in a copending application in the name of the present inventor and assigned to the present assignee entitled "Base Line Clipper for Spectrum Analyzer Display" and filed concurrently with this application Ser. No. 955,188, filed Oct. 27, 1978.

The various system phase relationships illustrated in FIG. 3 show the operation of FIG. 1 which is controlled by the system master clock A of FIG. 3A. Clocking signals $C_A$ and $C_L$ shown C and D in FIG. 3 naturally must have a phase delay, one with respect to the other, since $C_L$ drives the N bit latch 14 which controls Y deflection and $C_A$ drives the M bit horizontal counter 12 and M bit converter 13 which controls X deflection. Lastly, in B of FIG. 3, $C_C$ is the line generator frequency.

Referring again to FIG. 1, its operation is aptly illustrated by the following truth table:

| A = B | A < B | A > B | UP/DN | CLx-axis | $C_{LG}$ | Y-Deflection |
|-------|-------|-------|-------|----------|----------|--------------|
| 1 | 0 | 0 | x | CA | 0 | Stops |
| 0 | 1 | 0 | DN | 0 | Cc | Decreases |
| 0 | 0 | 1 | UP | 0 | Cc | Increases |

1 = True
0 = False
x = Don't Care

The independent control parameters in the truth table are the three outputs of comparator 18 designated A is equal to B, A is less than B, and A is greater than B. A comparison occurs each time a new dot is displayed since the previous data point or dot which has been displayed will have its value stored in the up/down counter 17 which drives through converter 16 the Y deflection amplifier. Thus, the next value or subsequent or adjacent data point to be displayed is clocked out of the N bit latch 14 by clock $C_L$ to the A input of comparator 18. If the new data, that is the A input to the comparator, is less than the counter output (B input to the comparator), as illustrated in the above table, the up/down counter is forced to count down at a rate $C_C$, meaning the Y deflection is decreasing, and a vertical downward line is drawn. See the example of FIG. 2. When this effective line reaches the new data point, A is equal to B which causes the INHIBIT line to inhibit the line generator 19 and enable clock $C_A$ in block 21 to increment the X axis address by incrementing horizontal counter 12 to the next data point. At the same time the next N bit latch data is presented to the magnitude comparator A input. Similarly, if this next data point were greater than the previous then the counter would count up as indicated by the above truth table.

It can be seen that any inequality between the counter output and data causes the memory read address and X deflection or horizontal scan axis to freeze or be inhibited, thereby maintaining the N bit memory output data constant and allowing the counter to count in the direction of the new data. Once equilibrium is reached between the counter and output data, the counter stops counting and the horizontal address keeps stepping until another inequality is detected. In this manner the counter goes through all binary counts between any two successive data points. The output of the N bit digital to analog converter 18 shows all the intermediate points between the two data points and displays them. The spacing of these intermediate points, which go to make up the connecting line, depends on the vertical resolution. For high resolution these intermediate points appear in a continuous straight line on the screen as shown in FIG. 2. Since the clock $C_C$ to the counter is constant, the line generated between any two successive data points is of constant intensity independent of its length. In other words, the horizontal or M bit scan is inhibited for a time proportional to the vertical axis displacement between the data point previously displayed and the new data point.

The true data points, however, will be of a higher intensity on the screen, than the intermediate points, since after the counter output becomes equal to the latch data, the counter will stay at that count until the horizontal address is advanced to the next count and the next N bit data is presented to the A input of the magnitude comparator. In most applications this is not undesirable. However, the brightness can be controlled by fully or partially blanking the Z-axis of the display during this time.

When the refresh rate of a display reaches a certain minimum frequency, the display tends to flash on and off or flicker. The clocks $C_C$ and $C_A$ may be selected for an optimum value depending on the specific application. In other words, if flickering might occur, then the $C_C$ clock rate can be increased to draw the connecting lines faster to reduce the overall time to advance from one horizontal address to another and concommitantly reduce the total time for the display of a frame. The total time for one frame display is dependent on two variables; first the total time to write lines between all the data points on the screen and secondly the total time to increment all addresses on the screen after their respective data points have been connected. By properly adjusting $C_C$ and $C_A$ this time may be minimized for eliminating the flickering condition.

As discussed above, the purpose of the invention is to draw an effective vertical line between data points. Optimum resolution for drawing such line is one that lets each dot at least touch its adjacent dot. Thus, for a given display intensity and a given writing rate, if each dot diameter is equal to d cms. and a full scale display is A cms., then the optimum resolution R is A/d. Thus the vertical resolution $2^N$ should be chosen so this is greater than or equal to A/d. In other words, the number of N bits in the binary counter 17 should be chosen accordingly. Of course, the resolution of the comparator 18 must match counter 17.

FIG. 4 is a detailed block diagram of the actual circuit implementation of the line generating portion of FIG. 1. Here N is eight bits and latched into the eight bit latch 14 which is in two portions. Comparator 18 is in two portions and is driven at its B input by the counter 17. The up/down direction data from comparator 18 actually drives a D-type flip-flop 26 with its Q output connected to the counter 17. The logic units 19 and 21 are each illustrated as two NAND gates. Thus an improved line connector for the data points of a digital storage spectrum analyzer has been provided.

What is claimed is:

1. A method of connecting data points on an X-Y type cathode ray tube display comprising the following steps: scanning horizontally on said display a predetermined number of discrete addresses; digitally storing said data points each corresponding to a vertical axis display displacement and each data point corresponding to one of said horizontal addresses; determining the vertical axis displacement between a data point being displayed at one address and the next data point to be displayed at another address; inhibiting said horizontal scan for a time proportional to said vertical axis displacement; and concurrently during said inhibiting time causing the display of an effective vertical line between said data points at one horizontal address.

2. A method as in claim 1 where said another address is the adjacent address to the address of said data point being displayed.

3. Apparatus for connecting data points on an X-Y type cathode ray tube display where such data points are stored in a digital memory at addresses corresponding to horizontal scan addresses of said display comprising: an up/down binary counter said counter storing binary data representing a previously displayed data point such data corresponding to a predetermined vertical axis display displacement; comparator means for comparing said stored binary data with a data point stored in said digital memory at a subsequent address and for causing said counter to count up or down depending on the vertical displacement of said data point of said subsequent address relative to said stored data point; vertical axis display means responsive to said counter counting up or down to concurrently display an effective vertical line at one horizontal address; horizontal axis display means; and means for inhibiting said horizontal axis display means at said one horizontal address during a time period said counter is counting up or down.

4. Apparatus as in claim 3 where said counter is driven at a constant rate irrespective of the amount of vertical displacement.

* * * * *